(12) United States Patent
Kobayashi et al.

(10) Patent No.: US 7,764,214 B2
(45) Date of Patent: Jul. 27, 2010

(54) ANALOG-TO-DIGITAL CONVERTER FOR CONVERTING INPUT ANALOG SIGNAL INTO DIGITAL SIGNAL THROUGH MULTIPLE CONVERSION PROCESSINGS

(75) Inventors: Shigeto Kobayashi, Gifu (JP); Atsushi Wada, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 8 days.

(21) Appl. No.: 12/183,615

(22) Filed: Jul. 31, 2008

(65) Prior Publication Data
US 2009/0033534 A1    Feb. 5, 2009

(30) Foreign Application Priority Data
Jul. 31, 2007    (JP) .............................. 2007-200086

(51) Int. Cl.
*H03M 1/38* (2006.01)
(52) U.S. Cl. ..................... 341/161; 341/155; 341/120
(58) Field of Classification Search ................ 341/155, 341/144, 118, 120, 161, 163
See application file for complete search history.

(56) References Cited

U.S. PATENT DOCUMENTS

| | | | |
|---|---|---|---|
| 6,683,554 B2* | 1/2004 | Nikai et al. ................ | 341/161 |
| 6,914,550 B2* | 7/2005 | Cai ............................ | 341/155 |
| 7,095,346 B2* | 8/2006 | Bogner ....................... | 341/120 |
| 7,116,255 B2* | 10/2006 | Lee et al. ................... | 341/144 |
| 7,250,880 B2* | 7/2007 | Hurrell et al. .............. | 341/111 |

FOREIGN PATENT DOCUMENTS

| | | |
|---|---|---|
| JP | 59-083418 | 5/1984 |
| JP | 63-110819 | 5/1988 |
| JP | 03-280719 | 12/1991 |
| JP | 9-275342 | 10/1997 |

OTHER PUBLICATIONS

Japanese Notification of Reason(s) for Refusal, w/ English translation thereof, issued in Japanese Patent Application No. JP 2007-200086 dated Jul. 7, 2009.

* cited by examiner

*Primary Examiner*—Peguy JeanPierre
(74) *Attorney, Agent, or Firm*—McDermott Will & Emery LLP

(57) ABSTRACT

A sub-A-D converter circuit converts a sampled analog signal into a digital signal of a predetermined number of bits. a D-A converter circuit converts the digital signal converted by the sub-A-D converter circuit into an analog signal to generate a residual signal to be processed by a subsequent conversion processing where the analog signal is to be removed from an analog signal to be sampled by the sub-A-D converter circuit. The D-A converter circuit is of a capacitor array type, and an offset compensation voltage used to compensate for at least part of an offset voltage added to the analog signal sampled by the sub-A-D converter circuit is supplied to at least one capacitor in the capacitor array.

14 Claims, 9 Drawing Sheets

ANALOG-TO-DIGITAL CONVERTER FOR CONVERTING INPUT ANALOG SIGNAL INTO DIGITAL SIGNAL THROUGH MULTIPLE CONVERSION PROCESSINGS

CROSS-REFERENCE TO RELATED APPLICATIONS

This application is based upon and claims the benefit of priority from the prior Japanese Patent Application No. 2007-200086, filed on Jul. 31, 2007, the entire contents of which are incorporated herein by reference.

BACKGROUND OF THE INVENTION

1. Field of the Invention

The present invention generally relates to analog-to-digital converters and it particularly relates to an analog-to-digital converter for converting input analog signal into digital signal through multiple conversion processings.

2. Description of the Related Art

With the development of the digital signal processing technologies, analog-to-digital converters (hereinafter referred to as "A-D converters") are increasingly mounted on various equipment and devices such as digital still cameras, digital movie cameras and mobile phones. One of kinds of A-D converters that excel both in conversion speed and conversion accuracy is a pipeline-type A-D converter.

The pipeline-type A-D converter is provided with a plurality of stages each of which is provided with a sub-A-D converter circuit. Each stage is provided with an amplifier circuit for amplifying a residual signal (obtained after the removal of a digital component converted by a sub-A-D converter circuit from an input signal to its own stage) and a sample-and-hold circuit for sampling and holding this input signal. The amplifier circuit and the sample-and-hold circuit generally include operational amplifiers as their circuit components, so that an offset voltage for the operational amplifier needs to be taken into account.

SUMMARY OF THE INVENTION

If a circuit and a control system for compensating for the aforementioned offset voltage are provided additionally, the circuit scale will be increased.

An analog-to-digital (A-D) converter according to one embodiment of the present invention converts an analog signal into a digital signal from a higher-order bit toward a lower-order bit through a plurality of times of conversion processings, and the A-D converter comprises: a sub-A-D converter circuit which converts a sampled analog signal into a digital signal of a predetermined number of bits; and a D-A converter circuit which converts the digital signal converted by said sub-A-D converter circuit into an analog signal to generate a residual signal to be processed by a subsequent conversion processing wherein the analog signal is to be removed from an analog signal to be sampled by said sub-A-D converter circuit, wherein the D-A converter circuit is of a capacitor array type, and wherein an offset compensation voltage used to compensate for at least part of an offset voltage added to the analog signal sampled by the sub-A-D converter circuit is supplied to at least one capacitor in the capacitor array.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which.

DETAILED DESCRIPTION OF THE INVENTION

The invention will now be described by reference to the preferred embodiments. This does not intend to limit the scope of the present invention, but to exemplify the invention.

In the following embodiments, a description is given of an analog-to-digital converter of a pipeline type and that of a cyclic type as an analog-to-digital (A-D) converter where analog signal is converted to digital signal a plurality of times.

A description is first given of the pipeline-type A-D converter.

Figure 1:
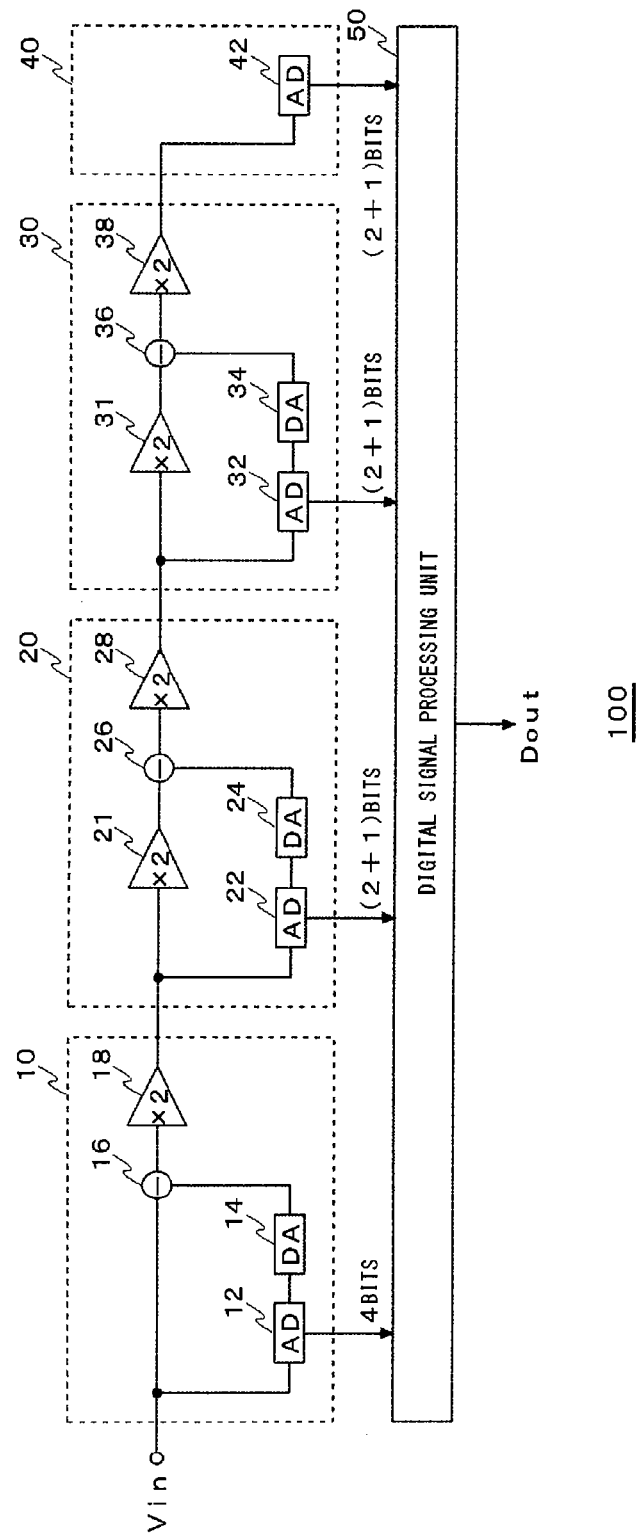
FIG. 1 shows a general structure of a pipeline-type analog-to-digital (A-D) converter according to a first embodiment of the present invention.

FIG. 1 shows a general structure of a pipeline-type A-D converter 100 according to a first embodiment of the present invention. The pipeline-type A-D converter 100 has four stages. That is, a first stage 10 converts part of an analog input signal into 4 bits; a second stage 20 and a third stage 30 each converts part of an input signal into 2 bits excluding a 1 redundancy bit; and a fourth stage 40 converts the input signal into 2 bits excluding a 1 redundancy bit and a fourth stage 40. Hence, this pipeline-type A-D converter 100 converts the input signal into the total of 10 bits. It is to be noted here that the number of stages and the number of bits described above are merely exemplary and not limited thereto.

The first stage 10 includes a first sub-A-D converter circuit 12, a first digital-to-analog (D-A) converter circuit 14, a first subtraction circuit 16, and a first amplifier circuit 18. Both the first sub-A-D converter circuit 12 and the first amplifier circuit 18 sample an input analog signal Vin at the practically identical timing. The first sub-A-D converter circuit 12 is of a flash-type structure. As described above, the resolution thereof is 4 bits.

The first sub-A-D converter circuit 12 converts components equivalent to the higher-order 4 bits of a sampled signal into a digital value and outputs the digital value to the first D-A converter circuit 14 and a digital signal processing unit 50. The first D-A converter unit 14 converts the digital value, obtained after the conversion done by the first sub-A-D converter circuit 12, into an analog value. This analog signal is a signal which is to be removed from the analog signal to be converted by the first sub-A-D converter circuit 12. Here, the "analog signal to be converted by the first sub-A-D converter unit 12" is not necessarily the signal which has been inputted to this stage 10. In a case where a second sample amplifier circuit 21 (described later) or the like is provided in parallel with the first sub-A-D converter circuit 12, this analog signal may be a signal outputted from the sample amplifier circuit 21.

The first subtraction circuit 16 subtracts the analog signal obtained after the conversion done by the first D-A converter circuit 14, from the input analog signal Vin sampled by the first amplifier circuit 18. The first amplifier circuit 18 amplifies a residual signal resulting from the subtraction of the former from the latter, by a predetermined gain so as to output the amplified residual signal to the second stage 20. Here, the signal is amplified by a factor of 2. The amplified residual signal is to be converted in the second stage 20.

The second stage 20 includes a second sample amplifier circuit 21, a second sub-A-D converter circuit 22, a second D-A converter circuit 24, a second subtraction circuit 26, and a second amplifier circuit 28. Both the second sub-A-D converter circuit 22 and the first sample amplifier circuit 21 sample the residual signal of the first stage 10 at the practically identical timing. The second sample amplifier circuit 21 amplifies the sampled residual signal by a predetermined gain. In the case of FIG. 1, the residual signal is amplified by a factor of 2.

The second sub-A-D converter circuit 22 is of a flash-type structure. As described above, the resolution thereof is 3 bits if the 1 redundancy bit is included. If the same reference voltage range as the range of the first sub-A-D converter circuit 12 is set to the second sub-A-D converter circuit 22, the number of bits to be converted by the second sub-A-D converter circuit 22 will be 2. Thus, the output signal of the first stage 10 must be amplified by a factor of $2^2$. That is, the range of the residual signal inputted to the second sub-A-D converter circuit 22 from the first stage 10 will not match with the reference voltage range of the second sub-A-D converter circuit 22 unless the output signal thereof has been amplifier by a factor of 4.

In this regard, the first amplifier circuit 18 amplifies the residual signal by a factor of 2 only. Thus, the reference voltage of each comparator provided in the second sub-A-D converter circuit 22 is set to ½ of that of the first sub-A-D converter circuit 12. Thereby, the reference voltage range of the second sub-A-D converter circuit 22 is set to ½ of that of the first sub-A-D converter circuit 12. As a result, the range of the residual signal inputted to the second sub-A-D converter circuit 22 from the first stage 10 can match with the reference voltage range of the second sub-A-D converter circuit 22.

The second sub-A-D converter circuit 22 converts components, in the sampled signal, corresponding to higher 5th and 6th bits into a digital value and adds a 1 redundancy bit so as to output them to the second D-A converter circuit 23 and the digital signal processing unit 50. The second D-A converter circuit 24 converts the output a digital value of the second sub-A-D converter circuit 22 into an analog value.

The second subtraction circuit 26 subtracts the analog signal obtained after the conversion performed by the second D-A converter circuit 24, from the residual signal of the first stage 10 which has been sampled and amplified by the second sample amplifier circuit 21. The second amplifier circuit 28 amplifies the residual signal resulting from the subtraction of the former from the latter, by a predetermined gain so as to output the amplified residual signal to the third stage 30. Here, the signal is amplified by a factor of 2.

The third stage 30 includes a third sample amplifier circuit 31, a third sub-A-D converter circuit 32, a third D-A converter circuit 34, a third subtraction circuit 36, and a third amplifier circuit 38. The third stage 30 converts components equivalent to the higher 7th and 8th bits into a digital value. The third stage 30 is configured the same way as with the second stage 20 and therefore the repeated description thereof is omitted here.

The fourth stage 40 includes a fourth sub-A-D converter circuit 42. The fourth sub-A-D converter circuit 42 converts the residual signal inputted from the third stage 30 into a digital value. That is, the fourth stage 40 converts components equivalent to the higher 9th and 10th bits into a digital value.

When the digital signal processing unit 50 receives the output digital values of all the stages, namely, the first stage 10, the second stage 20, the third stage 30 and the fourth stage 40, the digital signal processing unit 50 separates the redundancy bits from the output digital values so as to reconstruct the output digital values to a 10-bit digital value. Also, a Gray coded digital value outputted from each stage is converted to a binary coded digital value.

Figure 2:
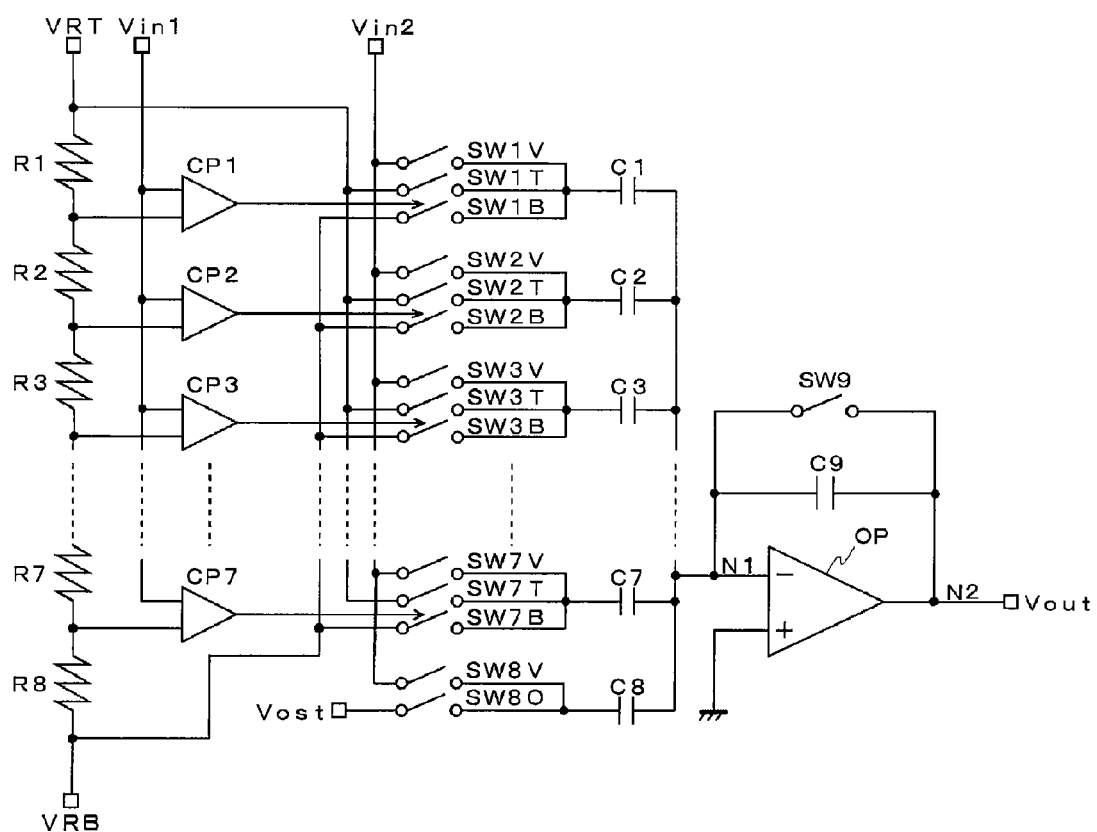
FIG. 2 shows a detailed structure of a second stage included in an A-D converter according to a first embodiment of the present invention.

FIG. 2 shows a detailed structure of the second stage 20 included in the A-D converter 100 according to the first embodiment. The second sub-A-D converter circuit 22 as shown in FIG. 1 is configured by a first resistor R1 to an eighth resistor R8, and a first comparator CP1 to a seventh comparator CP7. The second D-A converter circuit 24, the second subtraction circuit 26 and the second amplifier circuit 28 are constituted by a first capacitor C1 to an eighth capacitor C8, a ninth capacitor CP9, an operational amplifier OP, and various switches SW1 to SW9 that control those elements. Though FIG. 2 shows a single-ended structure, it goes without saying that a differential structure may be implemented instead.

The first resistor R1 to the eighth resistor R8 constitute a resistor string. A reference voltage top level VRT is applied to a high-potential-side terminal of the resistor string, whereas a reference voltage bottom level VRB is applied to a low-potential-side reference voltage thereof. Seven kinds of voltage levels which are voltage-divided by the first resistor R1 to the eighth resistor R8, respectively, are applied to reference voltage terminals of the first comparator CP1 to the seventh comparator CP7, respectively.

A residual signal Vin1 inputted from the preceding stage is inputted to input voltage terminals of the first comparator CP1 to the seventh comparator CP7. The first comparator CP1 to the seventh comparator CP7 each compares the residual signal Vin1 with a reference signal applied from the aforementioned resistor string. According to the result thereof, each comparator outputs a high-level signal or a low-level signal as a digital value. The second stage 20 converts part of the input signal into 3 bits including the 1 redundancy bit; and in order to be able to output eight different voltage levels, seven comparators are provided. The resistor string is constituted by eight resistors so that eight difference reference signals can be generated. Note that three comparators need to be provided if the second stage 20 converts part of the input signal into 2 bits.

The first capacitor C1 to the eighth capacitor C8 constitute a capacitor array. An offset compensation voltage Vost with which to compensate for at least part of offset voltage added to the analog signal sampled by the second sub-A-D converter circuit 22 is supplied to at least one of these capacitors C1 to C8 constituting the capacitor array. In the case of FIG. 2, the capacitor array includes capacitors the number of which is larger than the number of comparators by at least one. For the purpose of the optimal layout, the number of capacitors constituting the capacitor array is generally set to multiples of 2. The reference voltage top level or the reference voltage bottom level corresponding to the digital signal converted by the second sub-A-D converter circuit 22 is supplied to the first capacitor C1 to the seventh capacitor C7, which are one capacitor less than the capacitors C1 to C8 constituting the capacitor array. The above-mentioned offset compensation voltage Vost is supplied to the one remaining capacitor, namely the eighth capacitor C8. This offset compensation voltage Vost will be discussed later in detail.

More specific description is now given hereunder. Output-side terminals of the first capacitor C1 to the eighth capacitor C8 are connected to an inverting input terminal of the operation amplifier OP. Input-side terminals of the first capacitor C1 to the eighth capacitor C8 are each connected to a plurality of switches.

The input-side terminal of the first capacitor C1 is connected to a first signal switch SW1V, a first high-potential-side switch SW1T and a first low-potential-side switch SW1B. The same connection topology as with the first capacitor C1 applies also to the second capacitor C2 to the seventh capacitor C7. The input-side terminal of the eighth capacitor C8 is connected to an eighth switch SW8V and an offset switch SW8O.

With the first signal switch SW1V to the eighth signal switch SW8V being ON, an output signal Vin2 of the second sample amplifier circuit 21 is applied to the input-side terminals of the first capacitor C1 to the eighth capacitor C8. With the first high-potential-side switch SW1T to the seventh high-potential-side switch SW7T being ON, the reference voltage top level VRT is applied to the input-side terminals of the first capacitor C1 to the seventh capacitor C7. With the first low-potential-side switch SW1B to the seventh low-potential-side switch SW7B being ON, the reference voltage bottom level VRB is applied to the input-side terminals of the first capacitor C1 to the seventh capacitor C7.

The on and off of the first high-potential-side switch SW1T and the first low-potential-side switch SW1B are controlled by the output digital value of the first comparator CP1 in a complementary manner. If, for instance, the output digital value is a high-level signal, the first high-potential-side switch SW1T turns on and the first low-potential-side switch SW1B turns off. If it is a low-level signal, the on and off thereof are controlled in the opposite manner. The same applies to the second high-potential-side switch SW2T to the seventh high-potential-side switch SW7T and the second low-potential-side switch SW2B to the seventh low-potential-side switch SW7B. With the offset switch SW8O being ON, the above-mentioned offset compensation voltage Vost is applied to the input-side terminal of the eighth capacitor C8.

A predetermined fixed potential is applied to a noninverting input terminal of the operational amplifier OP. Though denoted by the ground symbol in FIG. 2, the predetermined fixed potential may be a reference voltage, such as a common-mode voltage, other than the ground potential. The ninth capacitor C9 is provided on a feedback path connecting the inverting input terminal and the output terminal of the operational amplifier OP. A short circuiting switch SW9 is provided in parallel with the ninth capacitor C9 and shorts the inverting input terminal and the output terminal of the operational amplifier OP so as to make the potential of a first node N1 and that of a second node N2 practically equal to each other.

An operation of the circuit shown in FIG. 2 is now described. First, the first signal switch SW1V to the eighth signal switch SW8V turn on, and the other switches connected to the input-side terminals of the first capacitor C1 to the eighth capacitor C8 turn off. The short circuiting switch SW9 turn on. Since the short circuiting switch SW9 is ON, the operational amplifier OP is in a unity-gain buffer state.

In this state, the reference voltage applied to the noninverting input terminal of the operational amplifier OP appears in the output-side terminals of the first capacitor C1 to the eighth capacitor C8. With the potentials of those output-side terminals being fixed, the first capacitor C1 to the eighth capacitor C8 store the output signal Vin2 of the second sample amplifier circuit 21 as an electric charge.

Also, the first comparator CP1 to the seventh comparator CP7 each compares the residual signal Vin1 with the aforementioned reference signal applied from the aforementioned resistor string. According to the result thereof, each comparator outputs a high-level signal or a low-level signal as a digital value.

Then the short circuiting switch SW9 turns off. In this state, the path through which the electric charge accumulated at the first node N1 flows out is cut off.

Then the first signal switch SW1V to the eighth signal switch SW8V turn off. At the same time, the on and off of the first high-potential-side switch SW1T to the seventh high-potential-side switch SW7T and the first low-potential-side switch SW1B to the seventh low-potential-side switch SW7B is controlled in accordance with the comparison result. Also, the offset switch SW8O turns on. In this state, the electric charge accumulated in the first capacitor C1 to the eighth capacitor C8 is redistributed to the first capacitor C1 to the ninth capacitor C9 so that the potential value at the first node N1 is practically equal to the potential value of the noninverting input terminal of the operational amplifier OP.

The law of conservation of electric charge holds for the electric charge accumulated in the first node N1 in the above-described process. Hence the residual signal Vout in this stage is generated where the components converted by the first comparator CP1 to the seventh comparator CP7 and the aforementioned offset compensation voltage Vost are removed from the output signal Vin2 of the second sample amplifier circuit 21.

If the capacitance value of the ninth capacitor C9 is set twice as much as the combined capacitance value of the first capacitor C1 to the eighth capacitance value C8 in the circuit configuration as shown in FIG. 2, the residual signal Vout of this stage can be doubled.

Though the structure of the second stage 20 has been described in FIG. 2, the structure of the third stage 30 is fundamentally the same. Note that if the number of bits to be converted differs, the number of comparators and the number of capacitors will also differ.

Figure 3:
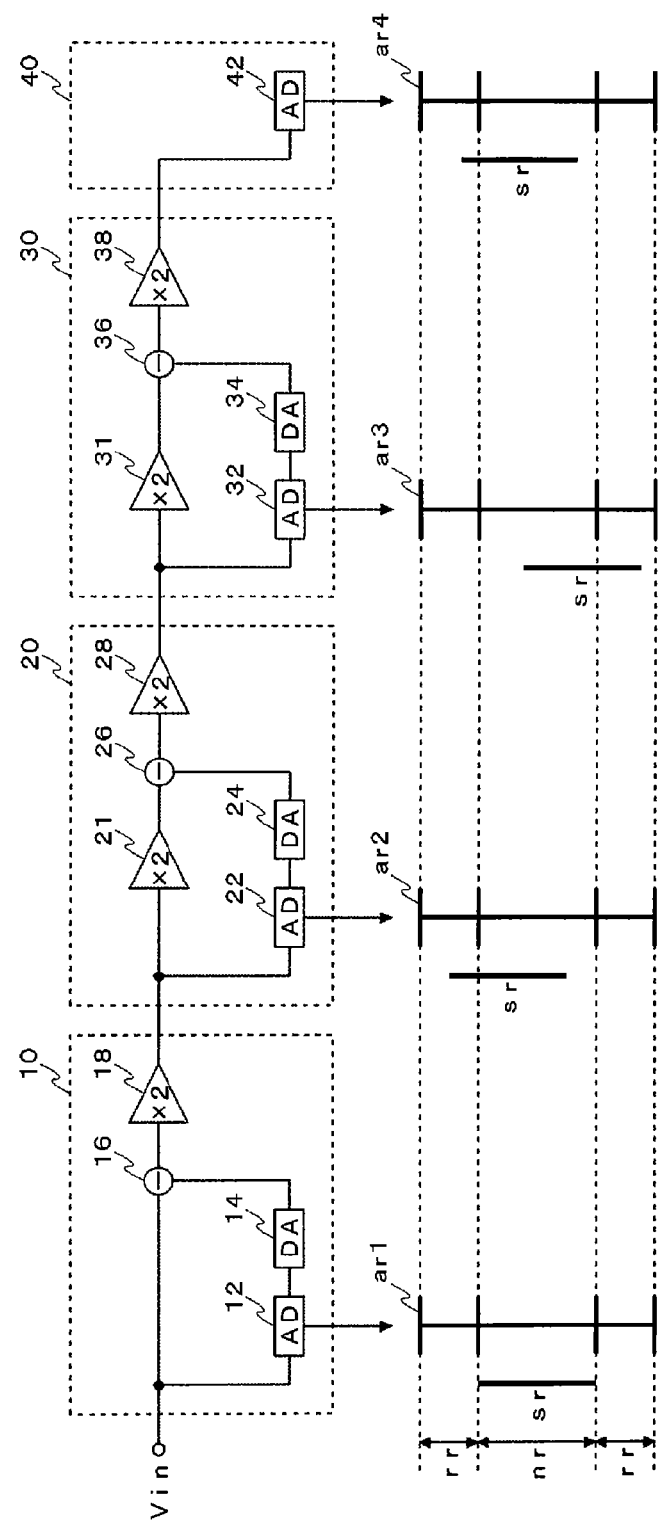
FIG. 3 shows voltage ranges of signal passing through the respective stages of a pipeline-type A-D converter according to a first embodiment of the present invention.

FIG. 3 shows voltage ranges of signal passing through the respective stages of the pipeline-type A-D converter 100 according to the first embodiment. Input allowable voltage ranges ar1 to ar4 of the respective sub-A-D converters at the respective stages are each composed of a normal range nr and a redundancy range rr. In FIG. 3, the redundancy ranges rr are reserved for both the high-potential side and the low-potential side of the normal range nr.

Out of circuit components that constitute the pipeline-type A-D converter 100, the offset voltage occurs mainly in the first amplifier circuit 18, the second sample amplifier circuit 21, the second amplifier circuit 28, the third sample amplifier circuit 31 and the third amplifier circuit 38. More specifically, the offset voltage occurs in the operational amplifier OP shown in FIG. 2. It is to be noted that the offset voltage to be compensated for by the aforementioned offset compensation voltage Vost may be an offset voltage of an operational amplifier that the signal to be compensated passes through in the past or an offset voltage of an operational amplifier that the signal to be compensated passes through in the future, or an offset value of both the operational amplifiers.

FIG. 3 illustrates an example where the offset voltage is added in a high-potential direction in each operational amplifier OP included in the first amplifier circuit 18, the second sample amplifier circuit 21, the second amplifier circuit 28, the third sample amplifier circuit 31 and the third amplifier circuit 38. The voltage range sr of the signal Vin inputted to the first sub-A-D converter circuit 12 matches or lies within the normal range nr of the first sub-A-D converter circuit 12. This is because the offset voltage of the amplifier circuit has not yet affected the input signal Vin.

The voltage range sr of the residual signal of the first stage 10, which is inputted to the second sub-A-D converter circuit 22, does not lie within the normal range nr of the second sub-A-D converter circuit 22. This is because the offset voltage of the first amplifier circuit 18 is added to the residual signal of the first stage 10 and the output voltage range sr of the residual signal shifts in the high-potential direction. Nevertheless, it is contained within the high-potential-side redundancy range rr and therefore it does not exceed the high-potential-side redundancy range rr. As the stage progresses in this manner, there is a possibility that the voltage range sr of the residual signal exceeds the redundancy range rr of a sub-A-D converter circuit in any of the stages. The correction can be made by the digital processing as long as it lies within the redundancy range rr; but the bit error will occur if it goes beyond the redundancy range rr.

In the light of this, a component designed to compensate for the offset voltage is added in the second D-A converter circuit 24. The aforementioned offset compensation voltage Vost corresponds to this component. The offset compensation voltage Vost may be a voltage that completely cancels out the offset component added to the analog signal sampled by the sub-A-D converter circuit, a voltage less than the offset component, or voltage greater than the offset component.

Also, at least one of a plurality of D-A conversion processings corresponding to a plurality of A-D conversion processings that use the pipeline-type A-D converter 100 or a cyclic-type A-D converter 200 (discussed later) may be assigned to a processing for supplying the offset compensation voltage Vost. For example, the offset compensation voltage Vost may be added using at least one of D-A converters in all stages of the pipeline-type A-D converter 100. It is preferable that the voltage range of the signal inputted to each sub-A-D converter circuit lies within each input allowable voltage range. In other words, it is preferable that the signals inputted to the respective stages lie within the voltage ranges ar1 to ar4, respectively, in all stages in the pipeline-type A-D converter 100 as a whole. Even if the voltage range exceeds the normal range nr, the voltage range will still be considered allowable as long as it does not exceed the redundancy range rr.

In the example shown in FIG. 3, the offset compensation voltage Vost is added to the analog voltage corresponding to the output digital value after conversion by the second sub-A-D converter circuit 22, in the second D-A converter circuit 24 of the second stage 20. More concretely, a positive offset compensation voltage Vost is added to the analog voltage corresponding to the output digital value converted by the second sub-A-D converter circuit 22 in order to compensate the residual signal in the low-potential direction wherein this residual signal inputted from the first stage 10 has been shifted in the high-potential direction. That is, the value of analog signal to be subtracted from this residual signal is made larger, and the aforementioned offset voltage is compensated.

In the example shown in FIG. 3, a structure is such that no offset compensation is performed in the third D-A converter circuit 34 of the third stage 30. Hence, a value larger than the offset voltage added in the first amplifier circuit 18 is compensated by the second D-A converter circuit 24 of the second stage 20. As a result, the voltage range sr of the residual signal inputted to the third sub-A-D converter circuit 32 is shifted towards the low-potential direction from the normal range nr. However, the voltage range sr is still contained within the redundancy range rr. Since the offset voltage is added in the high-potential direction in the third sample amplifier circuit 31 and the third amplifier circuit 38, the voltage range sr of the residual signal inputted to the fourth sub-A-D converter circuit 42 is more shifted towards the high-potential direction as compared with the voltage range sr of the residual signal inputted to the third sub-A-D converter circuit 32. As a result, the voltage range sr of the residual signal inputted to the fourth sub-A-D converter circuit 42 is closer to and more contained in the normal range nr.

The value of the above-mentioned offset compensation voltage Vost may be set to a value obtained through experiments or simulation runs carried out by a designer. The value of the offset compensation voltage Vost may be obtained based on parameters mainly including the position of a stage of the D-A converter circuit where the offset compensation voltage Vost is to be added, the number of D-A converter circuits to be added, and a targeted precision, and so forth.

Instead of taking an approach that obtains the optimal offset compensation voltage Vost, the above-mentioned parameters may be adjusted by using the existing potential for the offset compensation voltage Vost. Hence, no additional generation of potential values is required. Here, it is possible to use the power supply voltage, the ground voltage, the reference voltage top level VRT, or reference voltage bottom level VRB as the existing potential. Accordingly, the circuit configuration can be further simplified.

Figure 4:
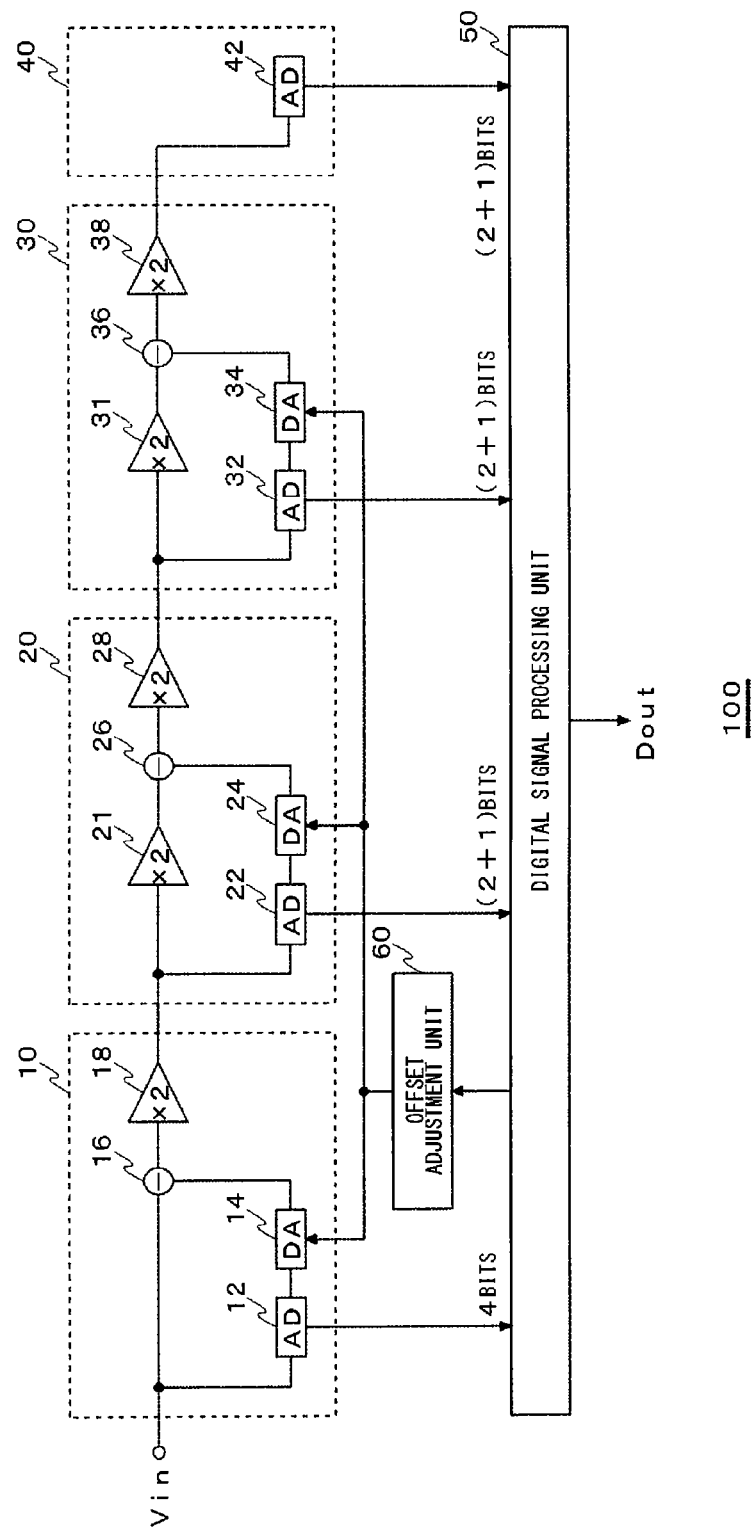
FIG. 4 shows an example of structure to determine a stage of a D-A converter circuit where an offset compensation voltage Vost is to be added.

FIG. 4 shows an example of structure to determine the stage of the D-A converter circuit where the offset compensation voltage Vost is to be added. FIG. 4 illustrates a structure where an offset adjustment unit 60 is added to the structure of the pipeline-type A-D converter 100 according to the first embodiment. The offset adjustment unit 60 estimates the offset voltage added in each stage, by referring to a digital value, namely a redundancy bit, outputted to the digital signal processing unit 50 from each sub-A-D converter circuit. Based on this estimation result, the offset adjustment unit 60 determines which D-A converter circuit the offset compensation voltage Vost is to be supplied to.

Assuming that there is one D-A converter circuit to which the offset compensation voltage Vost is to be added and the offset compensation voltage Vost is a given value, a description is given hereinbelow of an example for determining the position of stage of the D-A converter circuit to which the offset compensation voltage Vost is to be added.

Firstly, a predetermined test voltage, which is 0 V, for instance, is inputted to the pipeline-type A-D converter 100, and it is specified that in which stage of the A-D converter circuit the input voltage exceeds the input allowable voltage range. From the position of this stage, the offset voltage to be added in each stage is obtained, and it is determined which stage of the D-A converter circuit the offset compensation voltage is to be added to.

Figure 5:
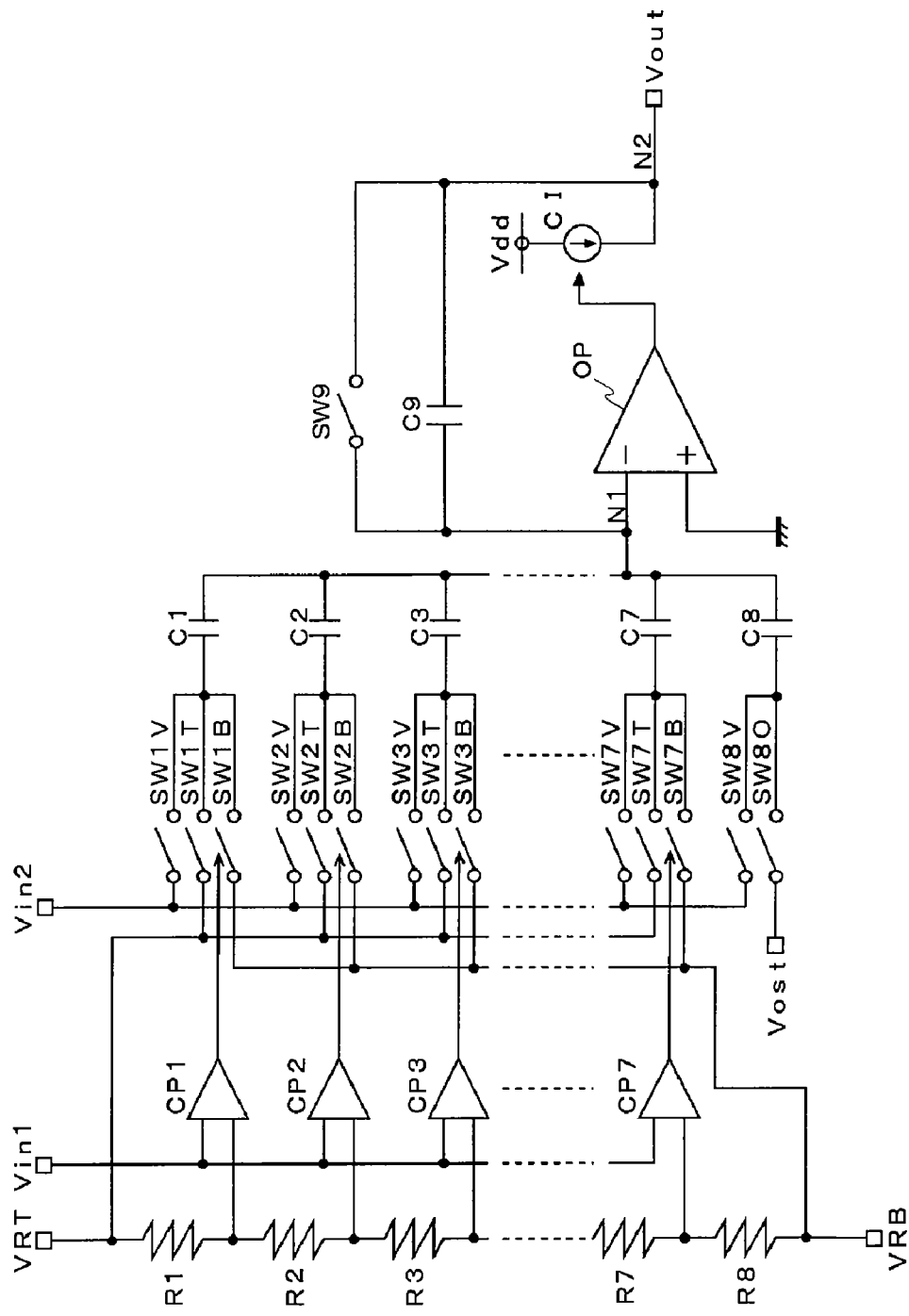
FIG. 5 shows a modification to a structure of a second stage shown in FIG. 2.

FIG. 5 shows a modification to the structure of the second stage 20 shown in FIG. 2. Though the output terminal of the operational amplifier OP is directly connected to the second node N2 in the case as shown in FIG. 2, the output terminal of the operation amplifier OP is connected to a control terminal of a constant current source CI in this modification as shown in FIG. 5. The constant current source CI may be configured by a P-channel transistor, for instance. In such a case, a power supply voltage Vdd is applied to a drain terminal thereof, whereas the output terminal of the operational amplifier OP is connected to a gate terminal thereof. The constant current source CI controls the current to be delivered to the second node N2 in response to the output signal of the operational amplifier OP.

Note that although in FIG. 2 the operational amplifier Op functions as part of an integration circuit, it functions as a comparator in FIG. 5 because no feedback path is provided. Therefore, the output signal of the operational amplifier OP as shown in FIG. 4 is a high-level or low-level signal and controls the on and off of the constant current source CI.

When the potential of the first node N1 inputted to the inverting input terminal of the operational amplifier OP, which functions as a comparator, exceeds a predetermined reference voltage inputted to the noninverting input terminal, the operational amplifier OP outputs a significant signal and enables the constant current source CI. As a result, the quantity of electric charge charged at the second node N2 varies depending on the timing at which the potential of the first node N1 exceeds the above-mentioned reference voltage.

Compared with the structure as shown in FIG. 2, there is no need to use a high-gain operational amplifier OP in the structure as shown in FIG. 5. Thus, such a structure as shown in FIG. 5 results in a reduced area in circuitry, reduced power consumption and lowered power supply voltage.

Figure 6:
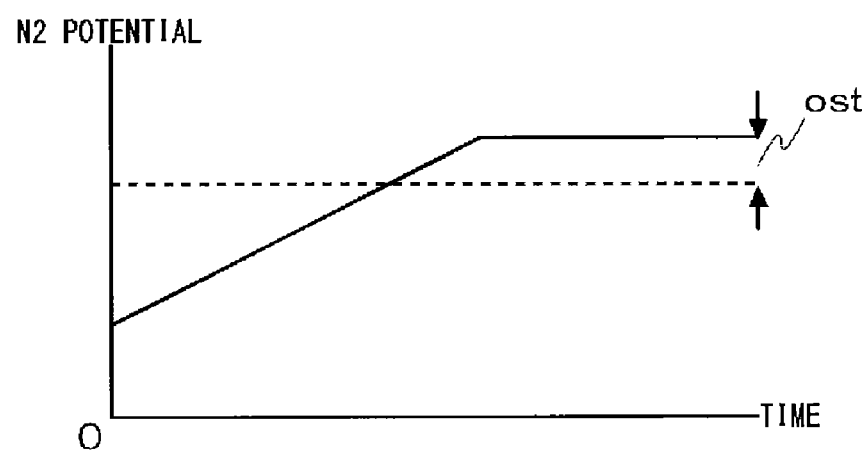
FIG. 6 shows the potential of a second node in the structure of a second stage shown in FIG. 5.

FIG. 6 shows the potential of the second node N2 in the structure of the second stage 20 shown in FIG. 5. The potential of the first node N1 exceeds the above-mentioned reference voltage and the potential of the second node N2 rises at a constant slope after the output signal of the operational amplifier OP has been inverted. When electric charge charged at the first node N1 is released, the output signal of the operational amplifier OP is inverted again before the charging to the second node N2 stops. This operation is provided for the preparation of the next sampling.

When the inversion of the output signal of the operational amplifier OP functioning as a comparator is delayed, an offset component ost is now produced at the second node N2. The level depicted by the dotted line in FIG. 6 shows the potential of the second node N2 obtained if the operational amplifier OP operates ideally. In FIG. 6, a state is shown where the inversion of the output signal of the operational amplifier OP is delayed. That is, it is the state that the electric charge is charged excessively at the second node N2.

As described above, the structure as shown in FIG. 5 has the above-described advantage over the structure as shown in FIG. 2 but has a disadvantage that the offset component is likely to be generated. That is, the offset component is generated due to not only a variation in devices or environments but also a shift in timing such as a delay. Thus, the means for compensating the offset is more important here.

According to the first embodiment as described above, the offset compensation voltage is supplied to a capacitor contained in the capacitor array. As a result, the increase in circuit scale can be suppressed and the effect of the offset components can be reduced. Accordingly, the conversion precision can be enhanced. Particularly if the number of stages is large and the number of amplifier circuits is large or if the circuit configuration as shown in FIG. 5 is employed in each stage, the effect of the offset components will be large. It often happens that the offset components cannot be compensated in the error correction by the digital processing using redundancy bits. Hence, adding the offset compensation voltage is required, but the existing circuit structure can be effectively utilized if the offset compensation voltage is supplied to the capacitor contained in the capacitor array.

Also, if the power supply voltage, the ground voltage, the reference voltage top level VRT, or the reference voltage bottom level VRB is used as the offset compensation voltage, there will be no need to generate another voltage using a DC-DC converter and the like. Thus, the increase in circuit scale can be suppressed. Also, the voltage is highly stabilized.

A description is now given of a cyclic-type A-D converter.

Figure 7:
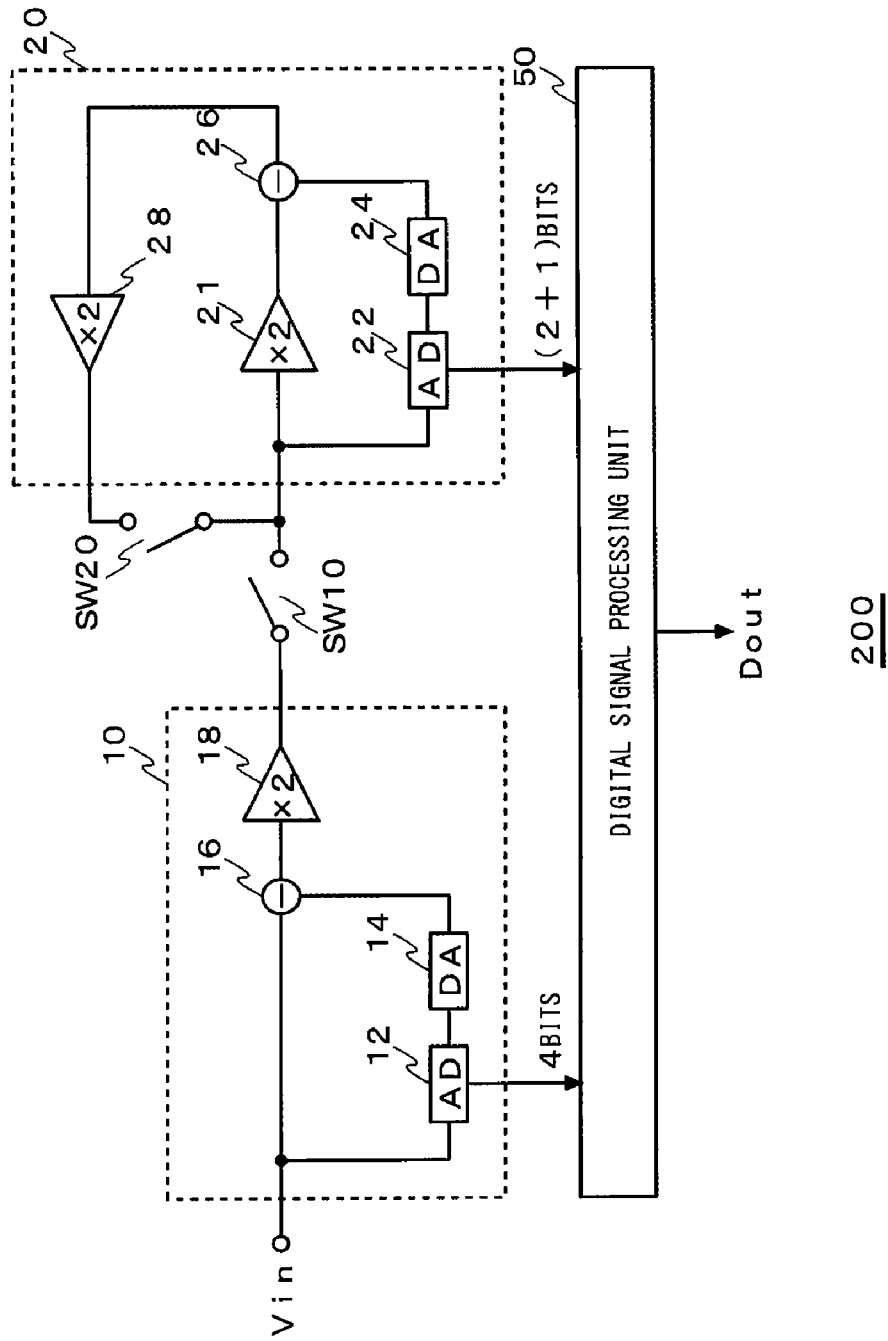
FIG. 7 shows a general structure of a cyclic-type A-D converter according to a second embodiment of the present invention.

FIG. 7 shows a general structure of a cyclic-type A-D converter 200 according to a second embodiment of the present invention. The cyclic-type A-D converter 200 has two stages. That is, a first stage 10 converts part of an input signal into 4 bits; and a second stage 20 converts it into 2 bits excluding a 1 redundancy bit. In the second stage 20, a residual signal outputted from the first stage 10 is circulated three times so as to be converted into 6 bits. Hence, this cyclic-type A-D converter 200 converts the input signal into the total of 10 bits. It is to be noted here that the number of stages and the number of bits described above are merely exemplary and not limited thereto. It is also possible to implement a structure where the signal my be circulated a plurality of times in a single stage.

The structure of the first stage 10 is the same as that of the first embodiment and therefore the repeated description thereof is omitted here. A second sample amplifier circuit 21 in the second stage 20 samples the residual signal outputted from the first stage 10 or a residual signal fed back from the output of the second stage 20 at practically the same timing as when a second sub-A-D converter circuit 22 samples the residual signal.

A second sample amplifier circuit 21 amplifies the sampled residual signal by a predetermined gain. In FIG. 7, the second sample amplifier circuit 21 amplifies it by 2×. If the second sample amplifier circuit 21 amplifies it by 1×, the second sample amplifier circuit 21 will function as a sample-and-hold circuit. A second subtraction circuit 26 subtracts an analog signal converted by a second D-A converter circuit 24 from a residual signal sampled and amplified by the second sample amplifier circuit 21. The second amplifier circuit 28 amplifies the residual signal, which has been obtained after the removal of the former from the latter, by a predetermined gain and feeds it back to the input of the second stage 20.

In the cyclic-type A-D converter 200 according to the second embodiment, a first input switching switch SW10 and a second input switching switch SW20 are provided between the first stage 10 and the second stage 20. The first input switching switch SW10 and the second input switching switch SW20 turn on and off in a complementary manner.

With the first input switching switch SW10 being ON and the second input switching switch SW20 being OFF, the residual signal outputted from the first stage 10 is inputted to the second sample amplifier circuit 21 and the second sub-A-D converter circuit 22. On the other hand, with the first input switching switch SW10 being OFF and the second input switching switch SW20 being ON, the residual signal fed back from the output of the second stage 20 is inputted to the second sample amplifier circuit 21 and the second sub-A-D converter circuit 22.

The above-described second sample amplifier circuit 21 may be designed using a circuit configuration where the circuit component corresponding to the sub-A-D converter circuit is removed from the circuit configuration shown in FIG. 2 or FIG. 5. Though in the second sample amplifier circuit 21 the number of capacitors to be connected to the inverting input terminal of the operational amplifier OP may be one fundamentally, a plurality of capacitors may be connected thereto.

If a plurality of capacitors are connected thereto, the second D-A converter circuit 24, the second subtraction circuit 26 and the second amplifier circuit 28 shown in FIG. 2 or FIG. 5 can be employed without any modification thereto. Whether there is a single capacitor or a plurality of capacitors, a structure may be such that the input signal and the reference voltage are selectively applied to the input-side terminal thereof. If there are a plurality of capacitors, the aforementioned offset compensation voltage Vost in place of the aforementioned input signal or the aforementioned reference voltage can be applied to at least one of the plurality of capacitors. Thus, an offset voltage compensation technique using the above-described capacitor array of the D-A converter circuit can be used similarly in a sampling capacitor array of the second sample amplifier circuit 21. Accordingly, at least one of capacitors in the sampling capacitor array of the D-A converter circuit and the sample amplifier circuit included in the cyclic-type A-D converter 200 can be used for the purpose of the offset voltage compensation.

Figure 8:
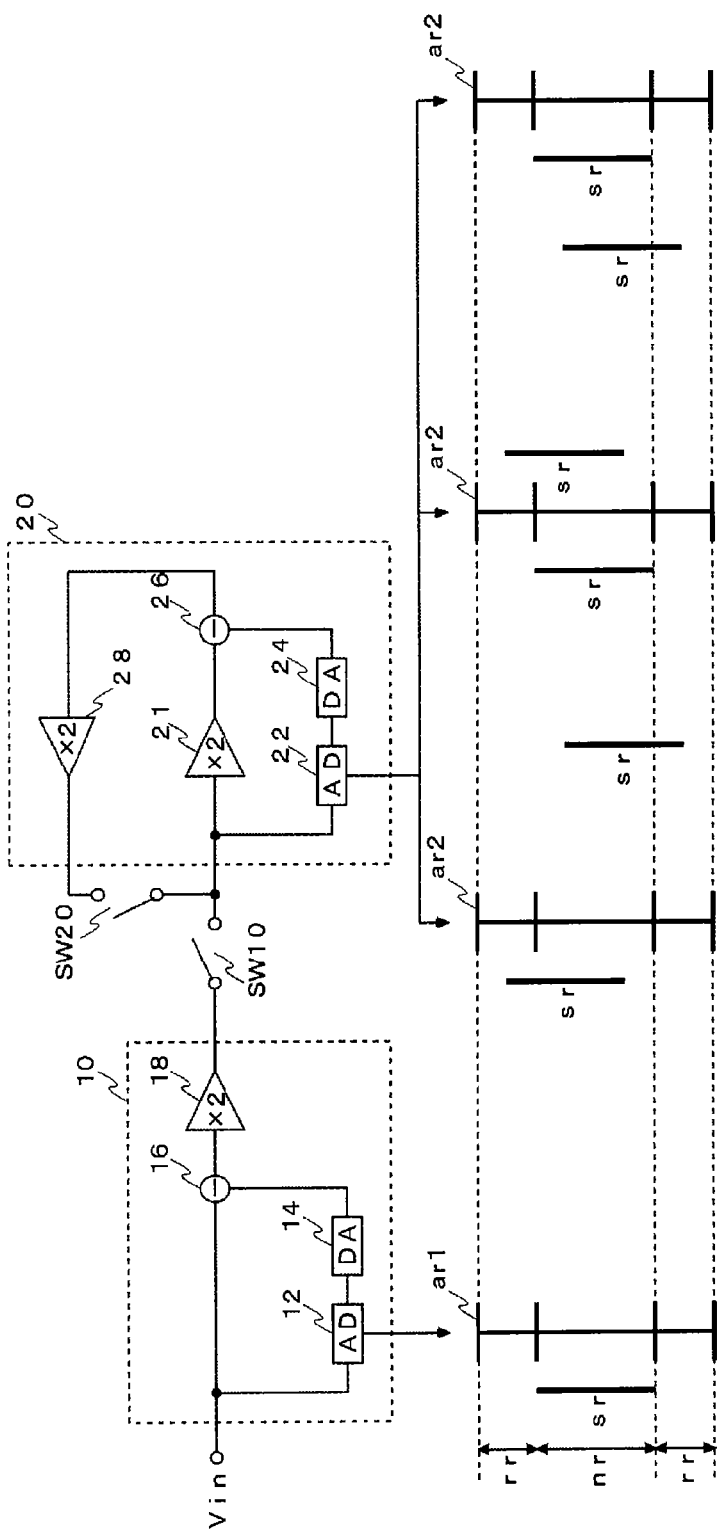
FIG. 8 shows voltage ranges of signal passing through the respective stages of a cyclic-type A-D converter according to a second embodiment of the present invention.

FIG. 8 shows voltage ranges of signal passing through the respective stages of a cyclic-type A-D converter 200 according to the second embodiment of the present invention. FIG. 8 illustrates an example where the offset voltage is added in a high-potential direction in each operational amplifier OP of the first amplifier circuit 18, the second sample amplifier circuit 21, and the second amplifier circuit 28. The voltage range sr of the signal Vin inputted to the first sub-A-D converter circuit 12 matches or lies within the normal range nr.

Since the offset voltage is added in the first amplifier circuit 18, the voltage range sr of the residual signal of the first stage 10 inputted to the second sub-A-D converter circuit 22 is shifted towards the high-potential direction. In contrast to this, in the first cycle the aforementioned offset voltage compensation voltage Vost is added to one of capacitors in the capacitor array of the second sample amplifier circuit 21.

As a result, the offset voltage added in the second sample amplifier circuit 21 and the second amplifier circuit 28 is compensated. Hence, the voltage range sr of the residual signal inputted to the second sub-A-D converter circuit 22 from the output of the second stage 20 matches with the normal range nr. In the second cycle, the aforementioned offset compensation voltage Vost is not added to the capacitor array of the second sample amplifier circuit 21 but added to one of capacitors in the capacitor array of the second D-A converter circuit 24. As a result, the voltage range sr of the residual signal inputted again to the second sub-A-D converter circuit 22 matches with the normal range nr.

In this manner, among the circuit elements in the cyclic-type A-D converter 200, the circuit element to which the offset compensation voltage Vost is to be added may be changed for each cycle in the stage where the signal is circulated. As described above, such elements to which the offset compensation voltage Vost is to be added include the D-A converter circuit and the sample amplifier circuit. Also, the value of the offset compensation voltage Vost may be varied for each cycle.

The offset compensation voltage Vost may be added in both the second sample amplifier circuit 21 and the second D-A converter circuit 24. In such a case, the offset compensation voltage Vost to be added may be varied for each cycle in the second sample amplifier circuit 21 and the second D-A converter circuit 24. For example, for the first cycle, the offset compensation voltage Vost with which to shift the voltage range towards the low-potential direction is added in the second sample amplifier circuit 21, whereas the offset compensation voltage Vost with which to shift the voltage range towards the high-potential direction is added in the second D-A converter circuit 24. For the second cycle, the offset compensation voltage Vost with which to shift the voltage range towards the high-potential direction is added in the second sample amplifier circuit 21, whereas the offset compensation voltage Vost with which to shift the voltage range towards the low-potential direction is added in the second D-A converter circuit 24. By employing such a processing described as above, adverse effects such as an element variation in capacitors contained in the capacitor array and a difference in environment on account of the mounting positions of capacitors contained in the capacitor array can be reduced.

According to the second embodiment as described above, the offset compensation voltage is supplied to a capacitor contained in the capacitor array. As a result, the increase in circuit scale can be suppressed and the effect of the offset components can be reduced. Accordingly, the conversion precision can be enhanced. In other words, the same advantageous effects as in the pipeline-type A-D converter can also be achieved in the cyclic-type A-D converter.

The present invention has been described based on two embodiments. These embodiments are merely exemplary, and it is understood by those skilled in the art that various modifications to the combination of each component and each process thereof are possible and that such modifications are also within the scope of the present invention.

Figure 9:
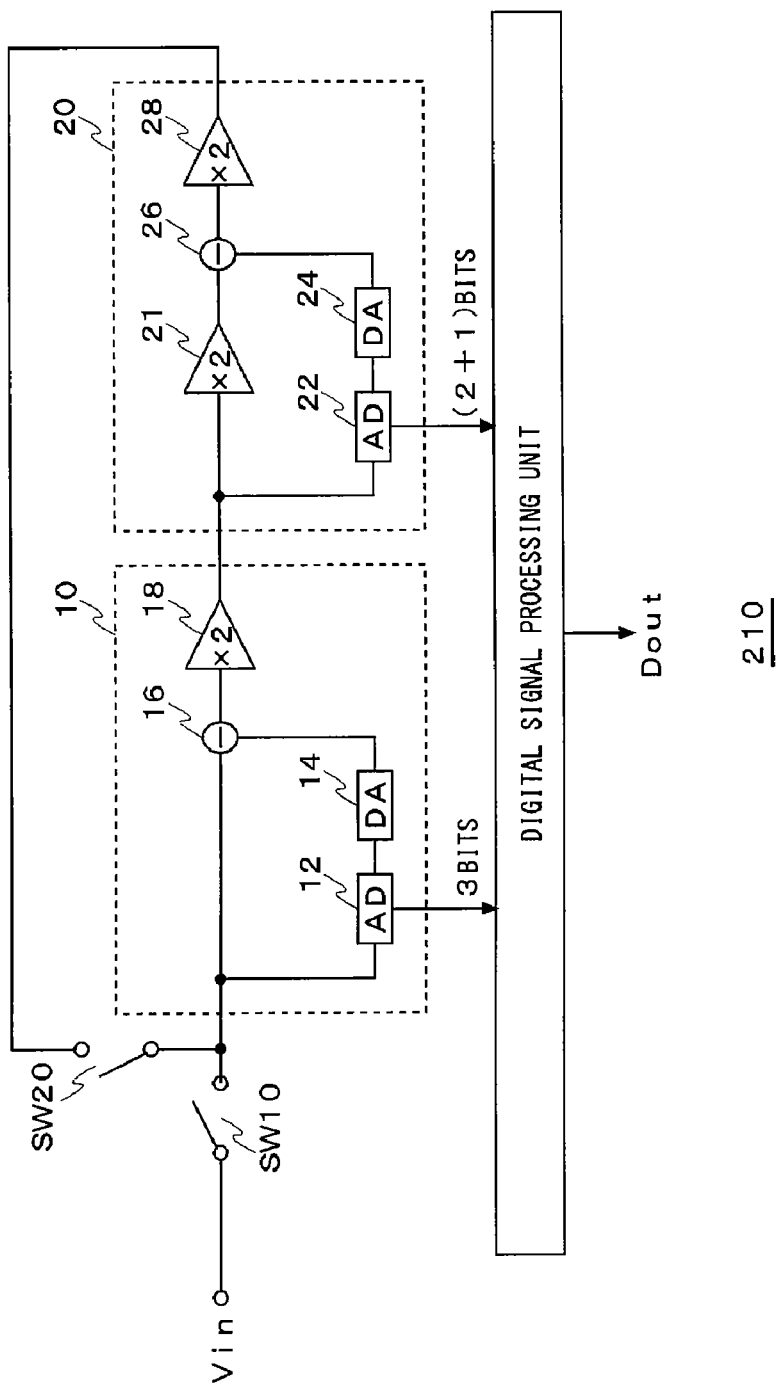
FIG. 9 shows a general structure of a cyclic-type A-D converter according to a modification.

FIG. 9 shows a general structure of a cyclic-type A-D converter 210 according to a modification.

This cyclic-type A-D converter 210 has two stages. That is, a first stage 10 converts part of an input signal into 3 bits; and a second stage 20 converts it into 2 bits excluding a 1 redundancy bit. The residual signal of the second stage is not fed back to the second stage 20 but fed back to the first stage 10. The first stage 10 again converts the input signal into 3 bits and therefore this cyclic-type A-D converter 210 converts the input signal into the total of 10 bits. The offset compensation means similar to that described in the second embodiment may be incorporated into an A-D converter like the A-D converter 210.

A sample amplifier circuit may be provided as appropriate in each stage of the first and the second embodiment. It is to be noted here that the parameters including the number of bits to be converted in each A-D converter circuit and the gains of the amplifier circuits are merely exemplary and not limited thereto.

While the exemplary embodiments of the present invention have been described using specific terms, such description is for illustrative purposes only, and it is to be understood that changes and variations may be further made without departing from the spirit or scope of the appended claims.

What is claimed is:

1. An analog-to-digital (A-D) converter, which converts an analog signal into a digital signal from a higher-order bit toward a lower-order bit through a plurality of times of conversion processings, the A-D converter comprising:

a sub-A-D converter circuit which converts a sampled analog signal into a digital signal of a predetermined number of bits; and a D-A converter circuit which converts the digital signal converted by said sub-A-D converter circuit into an analog signal to generate a residual signal to be processed by a subsequent conversion processing, wherein the analog signal generated by the D-A converter is to be removed from the analog signal to be converted by said sub-A-D converter circuit wherein said D-A converter circuit is of a capacitor array type, and wherein the capacitor array includes a plurality of capacitors, wherein a reference voltage top level or a reference voltage bottom level corresponding to the digital signal converted by said sub-A-D converter circuit is supplied to capacitors excluding at least one capacitor, and an offset compensation voltage used to compensate for at least part of an offset voltage added to analog signal sampled by said sub-A-D converter circuit is supplied to said at least one capacitor.

2. An analog-to-digital converter according to claim 1, wherein at least one of the conversion processings is carried out to supply the offset compensation voltage, among the plurality of times of D-A conversion processings, for generating the signal to be removed, which correspond to times of A-D conversion processings for converting an analog signal into a digital signal from a higher-order bit toward a lower-order bit.

3. An analog-to-digital converter according to claim 2, the analog-to-digital (A-D) converter being of a pipeline type where a plurality of conversion stages are connected, the A-D converter further comprising an offset adjustment unit which estimates an offset voltage added in each conversion stage, by referring to redundancy bits contained in the digital signals outputted from the plurality of conversion stages, respectively, wherein, based on an estimation result, said offset adjustment unit determines the D-A converter circuit which is to supply the offset compensation voltages, from among said D-A converter circuits provided in at least two stages of the plurality of conversion stages.

4. An analog-to digital converter according to claim 1, wherein a stage including said sub-A-D converter circuit and said D-A converter circuit constitutes a cyclic-type conversion stage, and the offset compensation voltage is set to different value for each cycle.

5. An analog-to-digital converter according to claim 1, the analog-to-digital (A-D) converter being of a pipeline type where a plurality of conversion stages are connected, the A-D converter further comprising an offset adjustment unit which estimates an offset voltage added in each conversion stage, by referring to redundancy bits contained in the digital signals outputted from the plurality of conversion stages, respectively, wherein, based on an estimation result, said offset adjustment unit determines the D-A converter circuit which is to supply the offset compensation voltage, from among said D-A converter circuits provided in at least two stages of the plurality of conversion stages.

6. An analog-to-digital converter according to claim 1, wherein the offset voltage is an offset voltage of first operational amplifier that a signal to be compensated passes through in the past or an offset voltage of a second operational amplifier that the signal to be compensated passes through in the future, or an offset voltage of both the first operational amplifier and the second operational amplifier.

7. An analog-to-digital converter, which converts an analog signal into a digital signal from a higher-order bit toward a lower-order bit through a plurality of times of conversion processings, the A-D converter comprising:

a sub-A-D converter circuit which converts a sampled analog signal into a digital signal of a predetermined number of bits; and a D-A converter circuit which converts the digital signal converted by said sub-A-D converter circuit into an analog signal to generate a residual signal to be processed by a subsequent conversion processing, wherein the analog signal generated by the D-A converter is to be removed from the analog signal to be converted by said sub-A-D converter circuit, wherein said D-A converter circuit is of a capacitor array type, wherein the capacitor array includes a plurality of capacitors, and wherein a reference voltage top level or a reference voltage bottom level corresponding to the digital signal converted by said sub-A-D converter circuit is supplied to capacitors excluding one capacitor, and an offset compensation voltage used to compensate for at least part of an offset voltage added to the analog signal sampled by said sub-A-D converter circuit is supplied to the one remaining capacitor.

8. An analog-to-digital converter according to claim 7, wherein at least one of the conversion processings is carried out to supply the offset compensation voltage, among the plurality of times of D-A conversion processings, for generating the signal to be removed, which correspond to the plurality of times of A-D conversion processings for converting an analog signal into a digital signal from a higher-order bit toward a lower-order bit.

9. An analog-to-digital converter according to claim 8, the analog-to-digital (A-D) converter being of a pipeline type where a plurality of conversion stages are connected, the A-D converter further comprising an offset adjustment unit which estimates an offset voltage added in each conversion stage, by referring to a redundancy bit contained in the digital signal, wherein, based on an estimation result, said offset adjustment unit determines the D-A converter circuit which is to supply the offset compensation voltage, from among said D-A converter circuits provided in at least two stages of the plurality of conversion stages.

10. An analog-to-digital converter according to claim 7, wherein a stage including said sub-A-D converter circuit and said D-A converter circuit constitutes a cyclic-type conversion stage, and the offset compensation voltage is set to different value for each cycle.

11. An analog-to-digital converter according to claim 7, the analog-to-digital (A-D) converter being of a pipeline type where a plurality of conversion stages are connected, the A-D converter further comprising an offset adjustment unit which estimates an offset voltage added in each conversion stage, by referring to redundancy bits contained in the digital signals outputted from the plurality of conversion stages, respectively, wherein, based on an estimation result, said offset adjustment unit determines the D-A converter circuit which is to supply the offset compensation voltage, from among said D-A converter circuits provided in at least two stages of the plurality of conversion stages.

12. An analog-to-digital converter according to claim 7, wherein the offset voltage is an offset voltage of first operational amplifier that a signal to be compensated passes through in the past or an offset voltage of a second operational amplifier that the signal passes through in the future, or an offset voltage of both the first operational amplifier and the second operational amplifier.

13. An analog-to-digital (A-D) converter, which converts an analog signal into a digital signal from a higher-order bit toward a lower-order bit through a plurality of times of conversion processings, the A-D converter comprising:

a sub-A-D converter circuit which converts a sampled analog signal into a digital signal of a predetermined number of bits; and a sample amplifier circuit which samples the analog signal in parallel with said sub-A-D converter circuit and amplifies the analog signal by a predetermined gain;

a D-A converter circuit which converts the digital signal converted by said sub-A-D converter circuit into an analog signal; and an output amplifier circuit which amplifies a residual signal, obtained after the analog signal converted by said D-A converter circuit has been removed from the analog signal amplified by said sample amplifier circuit, by a predetermined gain, and which outputs the amplified residual signal to said sub-A-D converter circuit or a subsequent sub-A-D converter circuit, wherein said sample amplifier circuit includes a sampling capacitor array, wherein the capacitor array includes a plurality of capacitors, wherein a reference voltage top level or a reference voltage bottom level corresponding to the digital signal converted by said sub-A-D converter circuit is supplied to capacitors excluding at least one capacitor, and an offset compensation voltage used to compensate for at least part of an offset voltage added to the analog signal sampled by said sub-A-D converter circuit is supplied to said at least one capacitor.

14. An analog-to-digital converter according to claim 13, wherein the offset voltage is an offset voltage of first operational amplifier that a signal to be compensated passes through in the past or an offset voltage of a second operational amplifier that the signal passes through in the future, or an offset voltage of both the first operational amplifier and the second operational amplifier.

* * * * *